US010468590B2

(12) United States Patent
Kardasz et al.

(10) Patent No.: US 10,468,590 B2
(45) Date of Patent: Nov. 5, 2019

(54) HIGH ANNEALING TEMPERATURE PERPENDICULAR MAGNETIC ANISOTROPY STRUCTURE FOR MAGNETIC RANDOM ACCESS MEMORY

(71) Applicant: Spin Memory, Inc., Fremont, CA (US)

(72) Inventors: Bartlomiej Adam Kardasz, Pleasanton, CA (US); Mustafa Michael Pinarbasi, Morgan Hill, CA (US); Jacob Anthony Hernandez, Morgan Hill, CA (US)

(73) Assignee: Spin Memory, Inc., Fremont, CA (US)

( * ) Notice: Subject to any disclaimer, the term of this patent is extended or adjusted under 35 U.S.C. 154(b) by 44 days.

(21) Appl. No.: 15/091,853

(22) Filed: Apr. 6, 2016

(65) Prior Publication Data

US 2016/0315118 A1    Oct. 27, 2016

Related U.S. Application Data

(60) Provisional application No. 62/150,785, filed on Apr. 21, 2015.

(51) Int. Cl.
*H01L 43/10* (2006.01)
*H01F 10/32* (2006.01)
(Continued)

(52) U.S. Cl.
CPC ......... *H01L 43/10* (2013.01); *H01F 10/3286* (2013.01); *H01F 41/302* (2013.01);
(Continued)

(58) Field of Classification Search
CPC ............. H01F 10/3272; H01F 10/3286; H01F 41/302; H01L 43/08; H01L 43/10; H01L 43/12
See application file for complete search history.

(56) References Cited

U.S. PATENT DOCUMENTS 341,801 A    5/1886  Fox
5,541,868 A  7/1996  Prinz
(Continued)

FOREIGN PATENT DOCUMENTS

AL   WO 2009-080636 A1   7/2009
CA        2766141 A1     1/2011
(Continued)

OTHER PUBLICATIONS

S. Ikeda, et al.; "A perpendicular-anisotropy CoFeB-MgO magnetic tunnel junction"; Nature Materials, vol. 9, Sep. 2010; pp. 721-724 (4 pages).
(Continued)

*Primary Examiner* — Bilkis Jahan
*Assistant Examiner* — Victor V Barzykin
(74) *Attorney, Agent, or Firm* — Arnold & Porter Kaye Scholer

(57) ABSTRACT

A perpendicular synthetic antiferromagnetic (pSAF) structure and method of making such a structure is disclosed. The pSAF structure can be a first high perpendicular Magnetic Anisotropy (PMA) multilayer and a second high PMA layer separated by a thin Ruthenium layer. Each PMA layer can be a first cobalt layer and a second cobalt layer separated by a nickel/cobalt multilayer. After each of the first and second PMA layers and the Ruthenium exchange coupling layer are deposited, the resulting structure goes through a high temperature annealing step, which results in each of the first and second PMA layers having a perpendicular magnetic anisotropy.

15 Claims, 9 Drawing Sheets

(51) Int. Cl.
*H01L 43/08* (2006.01)
*H01L 43/12* (2006.01)
*H01F 41/30* (2006.01)

(52) U.S. Cl.
CPC .............. *H01L 43/08* (2013.01); *H01L 43/12* (2013.01); *H01F 10/3272* (2013.01)

(56) References Cited

U.S. PATENT DOCUMENTS

| | | | |
|---|---|---|---|
| 5,629,549 A | 5/1997 | Johnson | |
| 5,640,343 A | 6/1997 | Gallagher et al. | |
| 5,654,566 A | 8/1997 | Johnson | |
| 5,691,936 A | 11/1997 | Sakakima et al. | |
| 5,695,846 A | 12/1997 | Lange et al. | |
| 5,695,864 A | 12/1997 | Slonczewski | |
| 5,732,016 A | 3/1998 | Chen et al. | |
| 5,856,897 A | 1/1999 | Mauri | |
| 5,896,252 A | 4/1999 | Kanai | |
| 5,966,323 A | 10/1999 | Chen et al. | |
| 6,016,269 A | 1/2000 | Peterson et al. | |
| 6,055,179 A | 4/2000 | Koganei et al. | |
| 6,097,579 A | 8/2000 | Gill | |
| 6,124,711 A | 9/2000 | Tanaka et al. | |
| 6,134,138 A | 10/2000 | Lu et al. | |
| 6,140,838 A | 10/2000 | Johnson | |
| 6,154,349 A | 11/2000 | Kanai et al. | |
| 6,172,902 B1 | 1/2001 | Wegrowe et al. | |
| 6,233,172 B1 | 5/2001 | Chen et al. | |
| 6,243,288 B1 | 6/2001 | Ishikawa et al. | |
| 6,252,798 B1 | 6/2001 | Satoh et al. | |
| 6,256,223 B1 | 7/2001 | Sun | |
| 6,292,389 B1 | 9/2001 | Chen et al. | |
| 6,347,049 B1 | 2/2002 | Childress et al. | |
| 6,376,260 B1 | 4/2002 | Chen et al. | |
| 6,385,082 B1 | 5/2002 | Abraham et al. | |
| 6,436,526 B1 | 8/2002 | Odagawa et al. | |
| 6,458,603 B1 | 10/2002 | Kersch et al. | |
| 6,493,197 B2 | 12/2002 | Ito et al. | |
| 6,522,137 B1 | 2/2003 | Sun et al. | |
| 6,532,164 B2 | 3/2003 | Redon et al. | |
| 6,538,918 B2 | 3/2003 | Swanson et al. | |
| 6,545,906 B1 | 4/2003 | Savtchenko et al. | |
| 6,563,681 B1 | 5/2003 | Sasaki et al. | |
| 6,566,246 B1 | 5/2003 | deFelipe et al. | |
| 6,603,677 B2 | 8/2003 | Redon et al. | |
| 6,653,153 B2 | 11/2003 | Doan et al. | |
| 6,654,278 B1 | 11/2003 | Engel et al. | |
| 6,677,165 B1 | 1/2004 | Lu et al. | |
| 6,710,984 B1 | 3/2004 | Yuasa et al. | |
| 6,713,195 B2 | 3/2004 | Wang et al. | |
| 6,714,444 B2 | 3/2004 | Huai et al. | |
| 6,744,086 B2 | 6/2004 | Daughton et al. | |
| 6,750,491 B2 | 6/2004 | Sharma et al. | |
| 6,765,824 B2 | 7/2004 | Kishi et al. | |
| 6,772,036 B2 | 8/2004 | Eryurek et al. | |
| 6,773,515 B2 | 8/2004 | Li et al. | |
| 6,777,730 B2 | 8/2004 | Daughton et al. | |
| 6,785,159 B2 | 8/2004 | Tuttle | |
| 6,812,437 B2 | 11/2004 | Levy et al. | |
| 6,829,161 B2 | 12/2004 | Huai et al. | |
| 6,835,423 B2 | 12/2004 | Chen et al. | |
| 6,838,740 B2 | 1/2005 | Huai et al. | |
| 6,842,317 B2 | 1/2005 | Sugita et al. | |
| 6,847,547 B2 | 1/2005 | Albert et al. | |
| 6,887,719 B2 | 5/2005 | Lu et al. | |
| 6,888,742 B1 | 5/2005 | Nguyen et al. | |
| 6,902,807 B1 | 6/2005 | Argoitia et al. | |
| 6,906,369 B2 | 6/2005 | Ross et al. | |
| 6,920,063 B2 | 7/2005 | Huai et al. | |
| 6,933,155 B2 | 8/2005 | Albert et al. | |
| 6,958,927 B1 | 10/2005 | Nguyen et al. | |
| 6,967,863 B2 | 11/2005 | Huai | |
| 6,980,469 B2 | 12/2005 | Kent et al. | |
| 6,985,385 B2 | 1/2006 | Nguyen et al. | |
| 6,992,359 B2 | 1/2006 | Nguyen et al. | |
| 6,995,962 B2 | 2/2006 | Saito et al. | |
| 7,002,839 B2 | 2/2006 | Kawabata et al. | |
| 7,005,958 B2 | 2/2006 | Wan | |
| 7,006,375 B2 | 2/2006 | Covington | |
| 7,009,877 B1 | 3/2006 | Huai et al. | |
| 7,041,598 B2 | 5/2006 | Sharma | |
| 7,045,368 B2 | 5/2006 | Hong et al. | |
| 7,149,106 B2 | 12/2006 | Mancoff et al. | |
| 7,170,778 B2 | 1/2007 | Kent et al. | |
| 7,190,611 B2 | 3/2007 | Nguyen et al. | |
| 7,203,129 B2 | 4/2007 | Lin et al. | |
| 7,227,773 B1 | 6/2007 | Nguyen et al. | |
| 7,262,941 B2 | 8/2007 | Li et al. | |
| 7,307,876 B2 | 12/2007 | Kent et al. | |
| 7,324,387 B1 | 1/2008 | Bergemont et al. | |
| 7,335,960 B2 | 2/2008 | Han et al. | |
| 7,351,594 B2 | 4/2008 | Bae et al. | |
| 7,352,021 B2 | 4/2008 | Bae et al. | |
| 7,376,006 B2 | 5/2008 | Bednorz et al. | |
| 7,378,699 B2 | 5/2008 | Chan et al. | |
| 7,449,345 B2 | 11/2008 | Horng et al. | |
| 7,476,919 B2 | 1/2009 | Hong et al. | |
| 7,502,249 B1 | 3/2009 | Ding | |
| 7,573,737 B2 | 8/2009 | Kent et al. | |
| 7,598,555 B1 | 10/2009 | Papworth-Parkin | |
| 7,619,431 B2 | 11/2009 | DeWilde et al. | |
| 7,630,232 B2 | 12/2009 | Guo | |
| 7,643,332 B2 | 1/2010 | Leuschner | |
| 7,679,155 B2 | 3/2010 | Korenivski | |
| 7,911,832 B2 | 3/2011 | Kent et al. | |
| 7,936,595 B2 | 5/2011 | Han et al. | |
| 7,986,544 B2 | 7/2011 | Kent et al. | |
| 8,014,193 B2 | 9/2011 | Nakayama et al. | |
| 8,279,663 B2 | 10/2012 | Nakayama et al. | |
| 8,279,666 B2 | 10/2012 | Dieny et al. | |
| 8,334,213 B2 | 12/2012 | Mao | |
| 8,357,982 B2 | 1/2013 | Kajiyama | |
| 8,363,465 B2 | 1/2013 | Kent et al. | |
| 8,456,883 B1 | 6/2013 | Liu | |
| 8,488,375 B2 | 7/2013 | Saida et al. | |
| 8,492,881 B2 | 7/2013 | Kuroiwa et al. | |
| 8,508,979 B2 | 8/2013 | Saida et al. | |
| 8,535,952 B2 | 9/2013 | Ranjan et al. | |
| 8,574,928 B2 | 11/2013 | Satoh et al. | |
| 8,576,616 B2 | 11/2013 | Saida et al. | |
| 8,582,355 B2 | 11/2013 | Saida et al. | |
| 8,617,408 B2 | 12/2013 | Balamane | |
| 8,716,817 B2 | 5/2014 | Saida | |
| 8,737,122 B2 | 5/2014 | Saida et al. | |
| 8,737,137 B1 | 5/2014 | Choy et al. | |
| 8,779,537 B2 | 7/2014 | Huai | |
| 8,823,118 B2 | 9/2014 | Horng | |
| 8,852,760 B2 | 10/2014 | Wang et al. | |
| 8,860,156 B2 | 10/2014 | Beach | |
| 8,878,317 B2 | 11/2014 | Daibou et al. | |
| 9,019,754 B1 | 4/2015 | Bedeschi | |
| 9,025,368 B2 | 5/2015 | Saida et al. | |
| 9,082,888 B2 | 7/2015 | Kent et al. | |
| 9,117,995 B2 | 8/2015 | Daibou et al. | |
| 9,159,342 B2 | 10/2015 | Kudo et al. | |
| 9,245,608 B2 | 1/2016 | Chen et al. | |
| 9,263,667 B1 | 2/2016 | Pinarbasi | |
| 9,299,918 B2 | 3/2016 | Daibou et al. | |
| 9,337,412 B2 | 3/2016 | Pinarbasi | |
| 9,362,486 B2 | 6/2016 | Kim et al. | |
| 9,378,817 B2 | 6/2016 | Lee et al. | |
| 9,379,314 B2 | 6/2016 | Park | |
| 9,406,876 B2 | 8/2016 | Pinarbasi | |
| 9,472,282 B2 | 10/2016 | Lee et al. | |
| 9,472,748 B2 | 10/2016 | Kuo et al. | |
| 9,484,527 B2 | 11/2016 | Han et al. | |
| 9,548,445 B2 | 1/2017 | Lee et al. | |
| 9,589,616 B2 | 3/2017 | Meng et al. | |
| 9,728,712 B2 | 8/2017 | Kardasz et al. | |
| 9,741,926 B1 | 8/2017 | Pinarbasi et al. | |
| 9,773,540 B2 | 9/2017 | Zang et al. | |
| 9,773,974 B2 | 9/2017 | Pinarbasi et al. | |
| 9,777,974 B2 | 10/2017 | Kamitani et al. | |
| 9,818,464 B2 | 11/2017 | Saida et al. | |

(56) References Cited

U.S. PATENT DOCUMENTS

| | | |
|---|---|---|
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1* | 1/2006 | Hong ............... B82Y 10/00 365/171 |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0015958 A1 | 1/2009 | Nakamura et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2009/0244792 A1 | 10/2009 | Nakayama et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0305077 A1 | 12/2011 | Higo et al. |
| 2012/0052258 A1 | 3/2012 | Op Debeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1* | 4/2014 | Sahoo ............... G11B 5/65 428/174 |
| 2014/0103472 A1 | 4/2014 | Kent et al. |
| 2014/0131824 A1 | 5/2014 | Kitagawa et al. |
| 2014/0159175 A1 | 6/2014 | Lee et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1* | 1/2015 | Min ............... H01F 10/32 257/421 |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2015/0372687 A1 | 12/2015 | Buhrman et al. |
| 2016/0027999 A1 | 1/2016 | Pinarbasi |
| 2016/0087193 A1 | 3/2016 | Pinarbasi |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1* | 6/2016 | Lee ............... H01L 43/02 257/421 |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |

(56) References Cited

U.S. PATENT DOCUMENTS

| | | | |
|---|---|---|---|
| 2017/0084826 | A1 | 3/2017 | Zhou et al. |
| 2017/0222132 | A1 | 8/2017 | Pinarbasi et al. |
| 2017/0236570 | A1 | 8/2017 | Kent et al. |
| 2017/0324029 | A1 | 11/2017 | Pinarbasi et al. |
| 2017/0331032 | A1 | 11/2017 | Chen et al. |
| 2017/0331033 | A1 | 11/2017 | Kardasz et al. |
| 2017/0346002 | A1 | 11/2017 | Pinarbasi et al. |
| 2018/0047894 | A1 | 2/2018 | Pinarbasi et al. |
| 2018/0076382 | A1 | 3/2018 | Park et al. |
| 2018/0114898 | A1 | 4/2018 | Lee |
| 2018/0205001 | A1 | 7/2018 | Beach et al. |
| 2018/0248110 | A1 | 8/2018 | Kardasz et al. |
| 2018/0248113 | A1 | 8/2018 | Pinarbasi et al. |

FOREIGN PATENT DOCUMENTS

| | | | |
|---|---|---|---|
| CN | 101036195 | A | 9/2008 |
| CN | 102334207 | A | 1/2012 |
| CN | 102959693 | A | 3/2013 |
| CN | 105706259 | A | 6/2016 |
| CN | 105917480 | A | 8/2016 |
| CN | 106062979 | A | 10/2016 |
| CN | 107750382 | A | 3/2018 |
| CN | 107851712 | A | 3/2018 |
| EP | 1345277 | A1 | 9/2003 |
| EP | 3298636 | A1 | 3/2018 |
| FR | 2817998 | A1 | 6/2002 |
| FR | 2832542 | A1 | 5/2003 |
| FR | 2910716 | A1 | 6/2008 |
| JP | H10-4012 | A | 1/1998 |
| JP | H11-120758 | A | 4/1999 |
| JP | H11-352867 | A | 12/1999 |
| JP | 2001-195878 | A | 7/2001 |
| JP | 2002-261352 | A | 9/2002 |
| JP | 2002-357489 | A | 12/2002 |
| JP | 2003-318461 | A | 11/2003 |
| JP | 2005-044848 | | 2/2005 |
| JP | 2005-150482 | A | 6/2005 |
| JP | 2005-535111 | A | 11/2005 |
| JP | 4066477 | B2 | 3/2006 |
| JP | 2006-128579 | A | 5/2006 |
| JP | 2008-524830 | A | 7/2008 |
| JP | 2009-027177 | A | 2/2009 |
| JP | 2012-004222 | | 1/2012 |
| JP | 2013-012546 | A | 1/2013 |
| JP | 2013-048210 | | 3/2013 |
| JP | 2013-219010 | A | 10/2013 |
| JP | 2014-039061 | A | 2/2014 |
| JP | 5635666 | B2 | 12/2014 |
| JP | 2015-002352 | A | 1/2015 |
| JP | 2017-510989 | A | 4/2017 |
| JP | 2017527097 | A | 9/2017 |
| JP | 2017532752 | A | 11/2017 |
| KR | 10-2014-0115246 | A | 9/2014 |
| KR | 10-2015-0016162 | A | 2/2015 |
| WO | WO 2011-005484 | A2 | 1/2011 |
| WO | 2014-062681 | A1 | 4/2014 |
| WO | WO-2015-153142 | A1 | 10/2015 |
| WO | 2016011435 | A1 | 1/2016 |
| WO | WO-2016-014326 | A1 | 1/2016 |
| WO | WO-2016-048603 | A1 | 3/2016 |
| WO | 2016171800 | A1 | 10/2016 |
| WO | 2016171920 | A1 | 10/2016 |
| WO | 2016204835 | A1 | 12/2016 |
| WO | 2017019134 | A1 | 2/2017 |
| WO | 2017030647 | A1 | 2/2017 |
| WO | 2017131894 | A1 | 8/2017 |
| WO | WO 2017/151735 | A1 | 9/2017 |

OTHER PUBLICATIONS

Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
NonFinal Office Action dated Feb. 8, 2017 in U.S. Appl. No. 15/174,482; 10 pages.
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Manfred Ernst Schabes, et al.; U.S. Appl. No. 15/634,629, filed Jun. 27, 2017, entitled "MRAM with Reduced Stray Magnetic Fields".
Soo-Man Seo, et al.; "Current-induced synchronized switching of magnetization;" Applied Physics Letters 101; 2012 American Institute of Physics; Aug. 7, 2012; 6 pages.
Pinarbasi, et a.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
Mustafa Pinarbasi, et al.; U.S. Appl. No. 15/656,398, filed Jul. 21, 2017, entitled "Memory Cell Having Magnetic Tunnel Junction and Thermal Stability Enhancement Layer".
Bartlomiej Adam Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Mustafa Pinarbasi, et al.; U.S. Appl. No. 15/674,620, filed Aug. 11, 2017, entitled "Polishing Stop Layer(s) for Processing Arrays of Semiconductor Elements".
Notice of Allowance dated Oct. 16, 2017 in U.S. Appl. No. 14/814,036; 16 pages.
Mustafa Michael Pinarbasi, et al.; U.S. Appl. No. 15/794,871, filed Oct. 26, 2017, entitled "Precessional Spin Current Structure for MRAM".
Michail Tzoufras, et al.; U.S. Appl. No. 15/858,950, filed Dec. 29, 2017, entitled "AC Current Pre-Charge Write-Assist in Orthogonal STT-MRAM".
Marcin Jan Gajek, et al.; U.S. Appl. No. 15/858,988, filed Dec. 29, 2017, entitled "Self-Generating AC Current Assist in Orthogonal STT MRAM".
Eric Michael Ryan, et al.; U.S. Appl. No. 15/859,015, filed Dec. 29, 2017, entitled "Shared Oscillator (STNO) for MRAM Array Write-Assist in Orthogonal STT-MRAM".
Michail Tzoufras, et al.; U.S. Appl. No. 15/859,030, filed Dec. 29, 2017, entitled "AC Current Write-Assist in Orthogonal STT-MRAM".
Kadriye Deniz Bozdag, et al.; U.S. Appl. No. 15/859,047, filed Dec. 29, 2017, entitled "Three-Terminal MRAM with AC Write-Assist for Low Read Disturb".
Manfred Ernst Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Manfred Ernst Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Manfred Ernst Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Manfred Ernst Schabes, et al.; U.S. Appl. No. 15/859,379, filed Dec. 30, 2017, entitled "Perpendicular Magnetic Tunnel Junction Device with Offset Precessional Spin Current Layer".
Manfred Ernst Schabes, et al.; U.S. Appl. No. 15/859,374, filed Dec. 30, 2017, entitled "Switching and Stability Control for Perpendicular Magnetic Tunnel Junction Device".
Mourad El Baraji, et al.; U.S. Appl. No. 15/859,514, filed Dec. 30, 2017, entitled "Microwave Write-Assist in Orthogonal STT-MRAM".
Mourad El Baraji, et al.; U.S. Appl. No. 15/859,517, filed Dec. 30, 2017, entitled "Microwave Write-Assist in Series-Interconnected Orthogonal STT-MRAM Devices".
International Search Report and Written Opinion dated Jul. 10, 2015 in PCT/US2015/021580; 12 pages.

(56) References Cited

OTHER PUBLICATIONS

Kardasz, et al.; U.S. Appl. No. 14/866,359, filed Sep. 25, 2015 entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Pinarbasi, et al.; U.S. Appl. No. 14/814,036, filed Jul. 30, 2015, entitled "Precessional Spin Current Structure for MRAM".
Pinarbasi, et al.; US Patent Application No. A73, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
"Magnetic Technology Sprintronics, Media and Interface"; Data Storage Institute, R&D Highlights; Sep. 2010; 3 pages.
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Magnetic Reversal in Nanoscopic Ferromagnetic Rings"; NSF grants PHY-0351964 (DLS); 2006; 23 pages.
Kirsten Martens, et al., "Thermally Induced Magnetic Switching in Thin Ferromagnetic Annuli"; NSF grants PHY-0351964 (DLS); 2005; 11 pages.
Andrew Kent, et al.; U.S. Appl. No. 61/715,111, filed Oct. 17, 2012, entitled "Inverted Orthogonal Spin Transfer Layer Stack".
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Aug. 2, 2018 in U.S. Appl. No. 15/674,620.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Office Action dated Aug. 30, 2018 in Chinese Patent Application No. 201580009984.2.
Office Action dated Oct. 9, 2018 in Japanese Patent Application No. 2016-526761.
International Search Report and Written Opinion dated May 10, 2018 in PCT/US2018/014645; 14 pages.
International Search Report and Written Opinion dated May 30, 2018 in PCT/US2018/014641; 13 pages.
Extended European Search Report dated Jan. 30, 2019 in EU Application No. 16812075.6.
Final Office Action dated Nov. 8, 2018 in U.S. Appl. No. 15/445,260.
Final Office Action dated Nov. 16, 2018 in U.S. Appl. No. 15/445,362.
NonFinal Office Action dated Nov. 23, 2018 in U.S. Appl. No. 15/859,384.
NonFinal Office Action dated Nov. 26, 2018 U.S. Appl. No. 15/858,950.
NonFinal Office Action dated Jan. 15, 2019 in U.S. Appl. No. 15/862,788.
NonFinal Office Action dated Mar. 22, 2019 in U.S. Appl. No. 16/027,739.
Notice of Allowance dated Oct. 24, 2018 in U.S. Appl. No. 15/859,517.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Notice of Allowance dated Feb. 12, 2019 in U.S. Appl. No. 15/859,381.
Notice of Allowance dated Mar. 21, 2019 in U.S. Appl. No. 15/858,950.
Restriction Requirement in U.S. Appl. No. 16/123,663 dated Apr. 24, 2019.

* cited by examiner

HIGH ANNEALING TEMPERATURE PERPENDICULAR MAGNETIC ANISOTROPY STRUCTURE FOR MAGNETIC RANDOM ACCESS MEMORY

CROSS-REFERENCE TO RELATED APPLICATION

This application claims the benefit of Provisional Application No. 62/150,785, filed Apr. 21, 2015. Priority to this provisional application is expressly claimed, and the disclosure of the provisional application is hereby incorporated herein by reference in its entirety.

FIELD

The present patent document relates generally to spin-transfer torque magnetic random access memory and, more particularly, to a magnetic tunnel junction stack having significantly improved performance of the free layer in the magnetic tunnel junction structure.

BACKGROUND

Magnetoresistive random-access memory ("MRAM") is a non-volatile memory technology that stores data through magnetic storage elements. In a type of MRAM, the magnetic storage elements comprise two ferromagnetic plates or electrodes that can hold a magnetic field and are separated by a non-magnetic material, such as a non-magnetic metal or insulator. Such a structure is called a magnetic tunnel junction. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% in up and 50% spin down electrons. Passing a current though a magnetic layer polarizes electrons with the spin orientation corresponding to the magnetization direction of the magnetic layer i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

MRAM devices are considered as the next gene at on structures for wide range of memory applications. One MRAM technology uses a perpendicular magnetic tunnel junction device. In perpendicular MTJ devices, the free and reference layers are separated by a thin insulator layer for spin polarized tunneling. The free and reference layers have a magnetic direction that is perpendicular to their planes, thus creating a perpendicular magnetic tunnel junction (pMTJ). The pMTJ configuration may provide a lower critical switching current when compared to in-plane MTJ technology, simplified layer stack structure without need of using thick antiferromagnetic layers, and reduction of the device size below 40 nm.

FIG. 1 illustrates a pMTJ stack 100 for a conventional MRAM device. As shown, stack 100 includes one or more seed layers 110 provided at the bottom of stack 100 to initiate a desired crystalline growth in the above-deposited layers. A perpendicular synthetic antiferromagnetic layer ("pSAF layer") 120 is disposed on top of the seed layers 110. MTJ 130 is deposited on top of synthetic antiferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the perpendicular SAF layer 120 is disposed over seed layer 110. Perpendicular SAF layer 120 also has an antiferromagnetic coupling layer 116 disposed over the first magnetic layer 114. As seen by the arrows in magnetic layers 114 and 132 of perpendicular SAF 120, layers 114 and 132 have a magnetic direction that is perpendicular to their respective planes. Furthermore, a nonmagnetic spacer 140 is disposed on top of MTJ 130 and a polarizer 150 may optionally be disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to pMTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RTE) process.

One of the key challenges in making pMTJ devices is the ability to create magnetically stable free and reference layers in the out-of-plane configuration for proper device operation. Such reference layers require high perpendicular magnetocrystalline anisotropy (PMA). In order to magnetically fix the reference layer, a perpendicular synthetic antiferromagnetic structure with high pinning fields (i.e., greater than 3 kG) must be formed.

In addition, achieving high perpendicular magnetic anisotropy (PMA) is a major challenge in development of perpendicular MRAM devices. Such devices require a fabrication of the pinned layers with PMA to serve as a reference layer in perpendicularly magnetized MTJs. Moreover, such structures need to withstand annealing temperatures up to 400 degrees Celsius for integration with underlying CMOS circuit structures used in conjunction with the MTJs.

Prior approaches to fabricate a pSAF such as SAF 120 used Co/Pd or Co/Pt multilayers. Perpendicular SAF structures made of Co/Pd or Co/Pt multilayers, however, fail when annealed at temperatures greater than 350 degrees Celsius by losing their perpendicular magnetic orientation and their antiparallel alignment in the pSAF structure. This is one of the significant limitations for device CMOS integration, which requires annealing at temperatures of 350 C or higher.

Thus, there is a need for pSAF for use with an MTJ device, where the pSAF has high PMA and can withstand a high annealing temperature so that the MTJ can be integrated with a CMOS device.

SUMMARY

An MRAM device is disclosed that has a magnetic tunnel junction stack and a pSAF that has high PMA and that can withstand high annealing temperatures. In an embodiment, a magnetic device is described that comprises a PMA seed multilayer comprised of a first seed layer and a nickel (Ni) seed layer, the Ni seed layer being disposed over the first seed layer. The device includes a first magnetic perpendicular magnetic anisotropy (PMA) multilayer disposed over the PMA seed multilayer, the first magnetic PMA multilayer comprising a first cobalt (Co) layer and a second Co layer, where the first Co layer and the second Co layer are separated by a first nickel/cobalt (Ni/Co) multilayer. The first magnetic PMA multilayer is annealed at a high temperature and has a magnetic direction perpendicular to its plane. The device includes a thin Ruthenium (Ru) antiferromagnetic interlayer exchange coupling layer disposed over the first magnetic PMA multilayer. The device also includes a second magnetic PMA multilayer disposed over the thin Ru antiferromagnetic interlayer exchange coupling layer. The second magnetic PMA multilayer comprises a third Co layer and a fourth Co layer, where the third Co layer and the fourth Co layer are separated by a second nickel/cobalt (Ni/Co) multilayer. The second magnetic PMA multilayer is annealed at the high temperature and has a magnetic direction perpendicular to its plane. The first magnetic PMA multilayer, the thin Ru interlayer exchange coupling layer and the second magnetic PMA multilayer form a perpendicular synthetic antiferromagnet.

In an embodiment, the first seed layer comprises alpha phase tantalum nitride.

In an embodiment, the first seed layer has a thickness of five nanometers.

In an embodiment, the first seed layer comprises tantalum.

In an embodiment, the first seed layer has a thickness of five nanometers.

In an embodiment, the high temperature is 350 degrees Celsius or higher.

In an embodiment, the first Co layer has a thickness of 0.3 nanometers and the second Co layer has a thickness of 0.18 nanometers.

In an embodiment, the first Ni/Co multilayer comprises a nickel layer having a thickness of 0.6 nanometers and a cobalt layer having a thickness of 0.2 nanometers.

In an embodiment, the first Ni/Co multilayer is repeated five times.

In an embodiment, the Ni seed layer of the PMA seed multilayer has a thickness ranging from 0.5 nanometers to 0.95 nanometers.

In an embodiment, the Ni seed layer of the PMA seed multilayer has a thickness of 0.93 nanometers.

In an embodiment, the thin Ruthenium (Ru) antiferromagetic interlayer exchange coupling layer has a thickness of 0.85 nanometers.

In an embodiment, the first Co layer has a thickness of 0.3 nanometers, the second Co layer has a thickness of 0.18 nanometers, the third Co layer has a thickness of 0.18 nanometers, the fourth Co layer has a thickness of 0.18 nanometers.

In an embodiment, the first Ni/Co multilayer comprise a first Ni layer having a thickness of 0.6 nanometers and fifth Co layer having a thickness of 0.2 nanometers.

In an embodiment, the first Ni/Co multilayer comprises five Ni/Co multilayers.

In an embodiment, the second Ni/Co multilayer comprise a sixth Co layer having a thickness of 0.2 nanometers and second Ni layer having a thickness of 0.6 nanometers.

In an embodiment, the second Ni/Co multilayer comprises five Ni/Co multilayers.

In an embodiment, the device comprises a non-magnetic tunneling barrier layer over the second magnetic PMA multilayer and a free magnetic layer over the non-magnetic tunneling barrier layer. The free magnetic layer having a magnetic direction that can precess between a first direction and a second direction. The non-magnetic tunneling barrier layer spatially separates the free magnetic layer from the second magnetic PMA multilayer. The second magnetic PMA multilayer, the non-magnetic tunneling barrier layer, and the free magnetic layer form a magnetic tunnel junction.

A embodiment for manufacturing a synthetic antiferromagnetic structure having a magnetic direction perpendicular its plane is also described. The method comprises depositing a PMA seed multilayer. The stop of depositing of PMA seed multilayer step comprises depositing a first seed layer, and depositing a nickel (Ni) seed layer over the first seed layer.

The method further comprises depositing a first magnetic perpendicular magnetic anisotropy (PMA) multilayer over the PMA seed multilayer. The step of depositing a first magnetic PMA multilayer step comprises depositing a first cobalt (Co) layer over the PMA seed multilayer, depositing a first nickel/cobalt (Ni/Co) multilayer over the first Co layer; and depositing a second Co layer over the first Ni/Co multilayer. The second Co layer is separated from the first Co layer by the first Ni/Co multilayer.

The method further comprises depositing a thin Ruthenium (Ru) antiferromagnetic interlayer exchange coupling layer over the first magnetic PMA multilayer, and depositing a second magnetic PMA multilayer over the thin Ru antiferromagnetic interlayer exchange coupling layer. The step of depositing of second magnetic PMA multilayer step comprises depositing a third Co layer over the thin Ru antiferromagnetic interlayer exchange coupling layer, depositing a second Ni/Co multilayer over the third Co layer, and depositing a fourth Co layer over the second Ni/Co multilayer. The fourth Co layer is separated from the third Co layer by the second Ni/Co multilayer.

The method further comprises annealing at high temperature for a time sufficient to increase perpendicular magnetic anisotropy of the first magnetic PMA multilayer and second magnetic PMA multilayer such that the first magnetic PMA multilayer has a magnetic direction perpendicular to its plane and the second magnetic PMA multilayer has a magnetic direct perpendicular to its plane.

In an embodiment, the annealing step comprises annealing at 350 degrees Celsius or higher.

In an embodiment, the annealing step further comprises annealing for a period of at least two hours.

In an embodiment, the depositing a first magnetic PMA multilayer step is performed by dc magnetron sputtering.

In an embodiment, the depositing a second magnetic PMA multilayer step is performed by dc magnetron sputtering.

In an embodiment, the depositing a Ni seed layer over the first seed layer step comprises depositing the Ni seed layer such that the Ni seed layer has a thickness of at least 0.93 nanometers.

In an embodiment, the depositing a first seed layer step comprises depositing a layer of alpha phase tantalum nitride.

In an embodiment, the depositing a layer of alpha phase tantalum nitride step comprises depositing a layer of alpha phase tantalum nitride having a thickness of at least 0.5 nanometers.

In an embodiment, the depositing a thin Ru antiferromagnetic interlayer exchange coupling layer comprises depositing a layer of Ru having a thickness of 0.85 nanometers.

In an embodiment, the method further comprises depositing a non-magnetic tunneling barrier layer over the second magnetic PMA multilayer; and depositing a free magnetic layer over the non-magnetic tunneling barrier layer. The free magnetic layer has a magnetic direction that can precess between a first direction and a second direction. The non-magnetic tunneling barrier layer spatially separates the free magnetic layer from the second magnetic PMA multilayer. The second magnetic PMA multilayer, the non-magnetic tunneling barrier layer, and the free magnetic layer form a magnetic tunnel junction.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
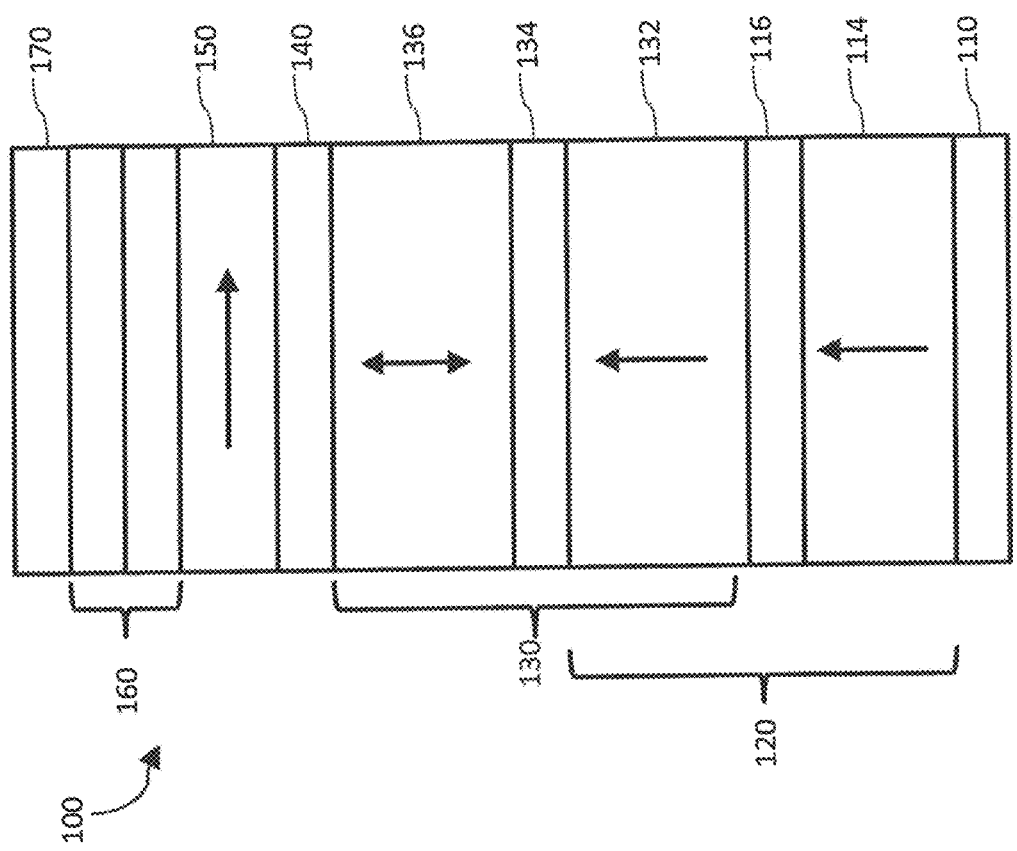
FIG. 1 illustrates a conventional perpendicular MTJ stack for an MRAM device.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a perpendicular synthetic antiferromagnetic device having high PMA and that is able to withstand high annealing temperatures so that an MTJ using such a pSAF can be integrated into a CMOS device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly represent five examples of the present teachings.

In the following description, for purposes of explanation only, specific nomenclature is set forth to provide a thorough understanding of the present teachings. However, it will be apparent to one skilled in the art that these specific details are not required to practice the present teachings.

As will now be discussed, the devices described herein have magnetic cobalt nickel Co/Ni multi layers deposited directly on specifically developed tantalum (Ta), tantalum nitride (TaN), tantalum nitride/nickel (TaN/Ni) seed layers followed by a high temperature annealing process (i.e., greater than 350 degrees Celsius) to achieve stable perpendicular magnetized structure. Such structures can be employed when fabricating perpendicular synthetic antiferromagnet (pSAF) with out-of-plane easy magnetic axis with high coercive field. When employed as pSAF, high pinning fields of up to 5 kG can be achieved. One of the advantages of the devices described herein is that stable PMA can be achieved by high temperature annealing when Ta or TaN, and Ni seed layers are used.

As will be seen, the new structure improves PMA stability for high temperature annealing and high pinning fields for fabrication of perpendicular magnetized reference layers for MRAM applications. The new structure also allows fabrication of a perpendicular polarizing layer in an orthogonal spin transfer torque device.

In perpendicular magnetized structures used in MRAM devices, the magnetization direction of a particular thin film used to manufacture a device is perpendicular to the plane of the device, and this magnetization direction exists without application of any external magnetic field. Such perpendicular magnetized structures can be achieved by fabricating multilayer structures comprising thin magnetic and non-magnetic layers such as cobalt (Co), palladium (Pd), nickel (Ni) and platinum (Pt). Subsequent repetition of such multilayers forces magnetic moments of individual magnetic layers to be directed perpendicular to the thin film plane. It has been found previously that perpendicular magnetic anisotropy in these multilayer structures arises from alloying and forming face-centered cubic (fcc) crystallographic structures ordered with an $L1_0$ ferromagnetic phase. An fcc crystallographic structure ordered with an $L1_0$ ferromagnetic phase has its easy axis along crystallographic direction, thus forming uniaxial out-of-plane easy magnetic axis directions.

However, proper seed layers must also be used to obtain uniaxial magnetic out-of plane symmetry. The seed layer has to provide a preferably fcc ordered template to initiate $L1_0$ magnetic phase. This is difficult to achieve because most of the commonly used thermally stable non-magnetic seed layer, e.g., tantalum (Ta), possess a body-centered cubic (bcc) crystallographic structure, which prefers in-plane magnetic ordering. Moreover, seed layer materials such as copper (Cu) or palladium (Pd) commonly used and are known to have low thermal stability. Copper (Cu) or palladium (Pd) are also known to diffuse during the annealing process and thus degrade device performance by lowering tunneling magnetoresistance (TMR).

To achieve the benefits of using an fcc crystallographic structure without these disadvantages, the various embodiments described herein utilize cobalt nickel Co/Ni multilayers (which will form the magnetic layers of a synthetic antiferromagnetic structure) that are deposited directly by dc magnetron sputtering on tantalum/nickel (Ta/Ni) or alpha phase tantalum nitride/nickel (TaN/Ni) seed layers. As will be discussed in the context of FIGS. 3 and 6, use of an α-TaN/Ni seed layer promotes the PMA character of Co/Ni structures, but only after annealing. Note that as used herein, α-TaN refers to alpha phase tantalum nitride.

Figure 2:
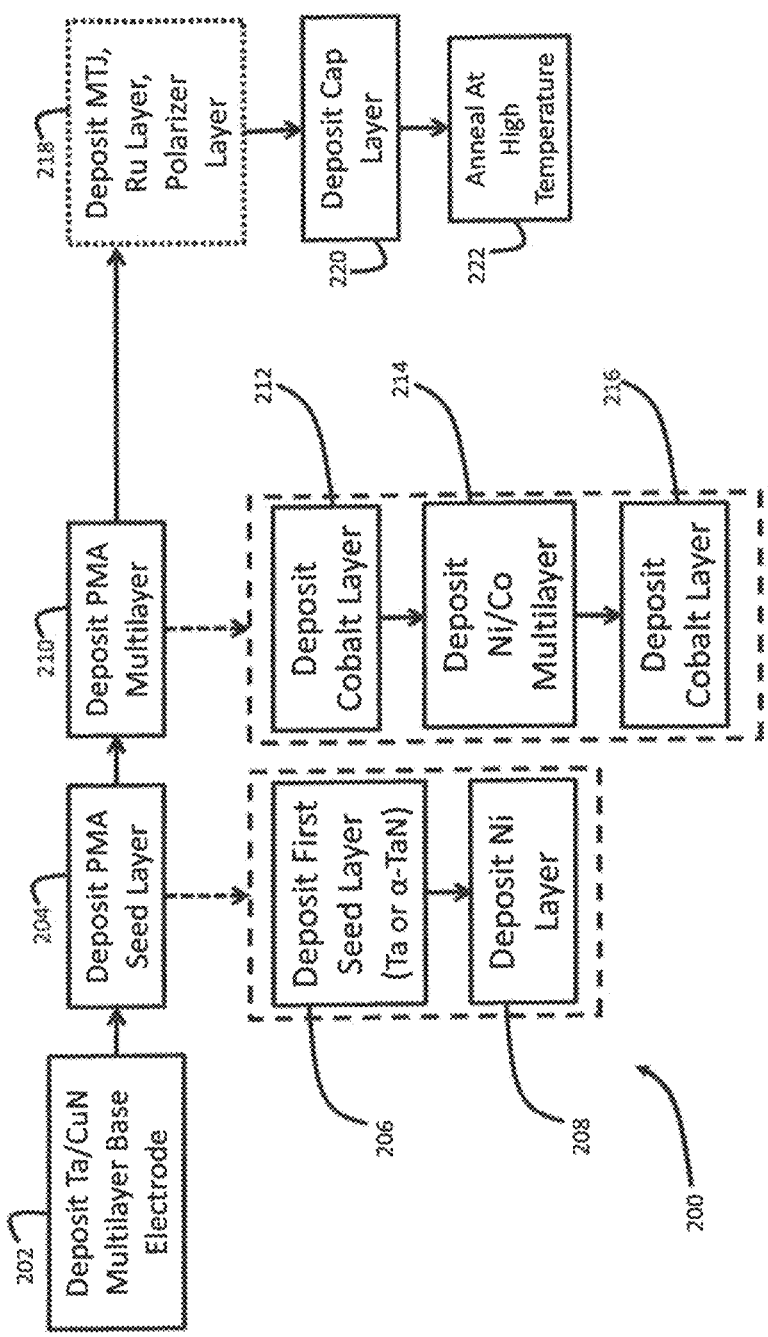
FIG. 2 illustrates a process for manufacturing a magnetic device using the concepts described herein.
Figure 3:
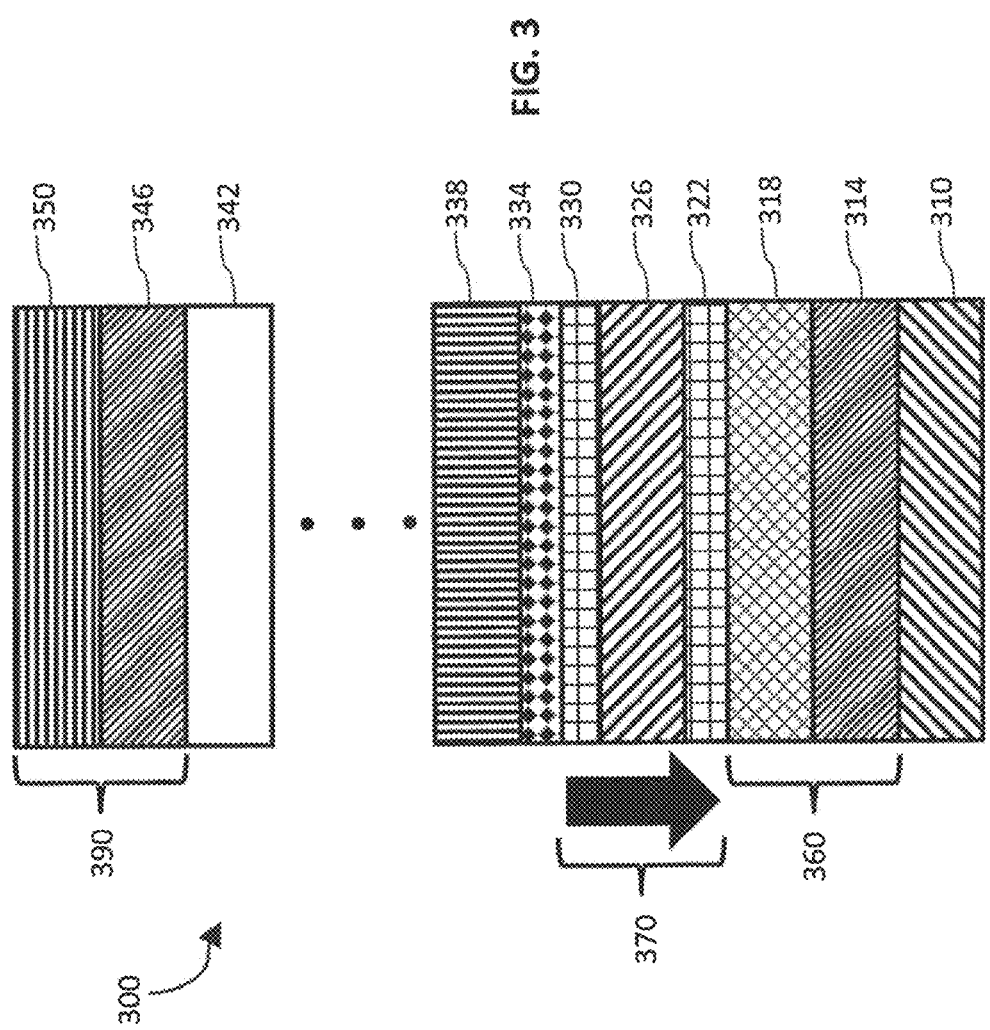
FIG. 3 illustrates the various layers of a magnetic device manufactured in accordance with the teachings described herein.

With reference to FIGS. 2 and 3, an embodiment of a magnetic structure 300 in accordance with the present teachings will now be discussed. A process 200 for fabricating a stack of materials forming structure 300 having a seed layer that can withstand high annealing temperatures is shown in FIG. 2, while the resulting device 300 is shown in FIG. 3. At step 202, a bottom electrode 310 is deposited. Such a bottom electrode 310 can be deposited on a semiconductor wafer or other appropriate substrate structure. Bottom electrode 310 can comprise a Ta/CuN multilayer. In one embodiment, the Ta layer of the multilayer has a thickness of three nanometers. In other embodiments, the Ta layer can have a range of 0.5 nm to 10 nm. In an embodiment, the CuN layer of the multilayer has a thickness of forty nanometers. In an embodiment, the CuN layer of the multilayer has a thickness of forty nanometers. In other embodiments, the CuN layer can have a range of 2 nm to 100 nm.

At step 204, a PMA seed multilayer 360 is deposited. In an embodiment, deposition of PMA seed multilayer is performed in an nitrogen (N2) atmosphere. PMA seed multilayer can comprise several layers. At step 206, first seed layer 314 is deposited. First seed layer 314 can comprise either a Ta layer or an α-TaN layer. At step 208, a Ni layer 318 is deposited over first seed layer 314. When first seed layer 314 comprises a layer of α-TaN layer, step 206 can be performed by sputtering α phase TaN in an nitrogen (N2) atmosphere. When first seed layer 314 is a Ta layer, it can have a thickness of five nanometers, and in other embodiments, can have a thickness ranging from 0.5 nm to 10 nm. Likewise, when first seed layer 314 comprises a layer of α-TaN, it can have a thickness ranging from 0.5 nm to 10 nm. Ni layer 318 can have a thickness of 0.93 nm, and in other embodiments, can have a thickness ranging from 0.2 nm to 2 nm.

At step 210, magnetic PMA multilayer 370 is deposited. As seen in FIGS. 2 and 3, magnetic PMA multilayer 370 comprises a first cobalt layer 322 and a second cobalt layer 330, separated by a Ni/Co multilayer 326. The process of depositing magnetic PMA multilayer 370 (step 210) is comprised of step 212, in which Co layer 322 is deposited, step 214, in which the Ni/Co multilayer 326 is deposited, and step 216, in which Co layer 330 is deposited. Steps 212, 214 and 216 can be performed using dc magnetron sputtering techniques. Note that magnetic PMA multilayer 370 will not actually exhibit any PMA after deposition. In order for magnetic PMA multilayer 370 to exhibit PMA, annealing step, step 222 (to be discussed) must be performed.

In an embodiment, Co layer 322 has a thickness of 0.3 nm, and in other embodiments can have a thickness ranging from 0.1 to 0.3 nm. In an embodiment, Ni/Co multilayer 326 can comprise five Ni/Co multilayers, with the Ni layer having a thickness of 0.6 nm and the Co layer having a thickness of 0.2 nm. In other embodiments, each Ni/Co multilayer 326 can comprise Ni layers having a thickness ranging from 0.1 to 0.3 nm and Co layers having a thickness ranging from 0.1 to 3 nm. Likewise, in an embodiment, Co layer 330 has a thickness of 0.18 nm, and in other embodiments can have a thickness ranging from 0.1 to 0.3 nm.

After depositing the magnetic PMA multilayer 370 in step 210, any remaining MRAM layers can be deposited, as desired. For example, at step 218, remaining MTJ layers (e.g., non-magnetic tunneling barrier layer 334 and free layer 338), polarizer layer (not shown), if present, and Ru layer 342 are deposited. Note that this is not required, and therefore, FIG. 2 shows step 218 as an optional step (i.e., with a dotted line). Thereafter, at step 220, cap 390 can be deposited. In an embodiment, cap 390 can be made of either a layer of Ta or an α-TaN layer (shown as layer 346), where the Ta layer (when used) has a thickness of 2 nm while the α-TaN layer (when used) has a thickness of 2 nm. In other embodiments, the Ta layer can have a thickness in the range of 0.5 nm to 20 nm while the α-TaN layer can have a thickness in the range of 0.5 to 20 nm. Cap 390 can also comprise a Ru layer 350. In an embodiment, Ru layer 350 has a thickness of 5 nm, and in other embodiments, the Ru layer 350 can have a thickness in the range of 0.5 nm to 20 nm.

Figure 4:
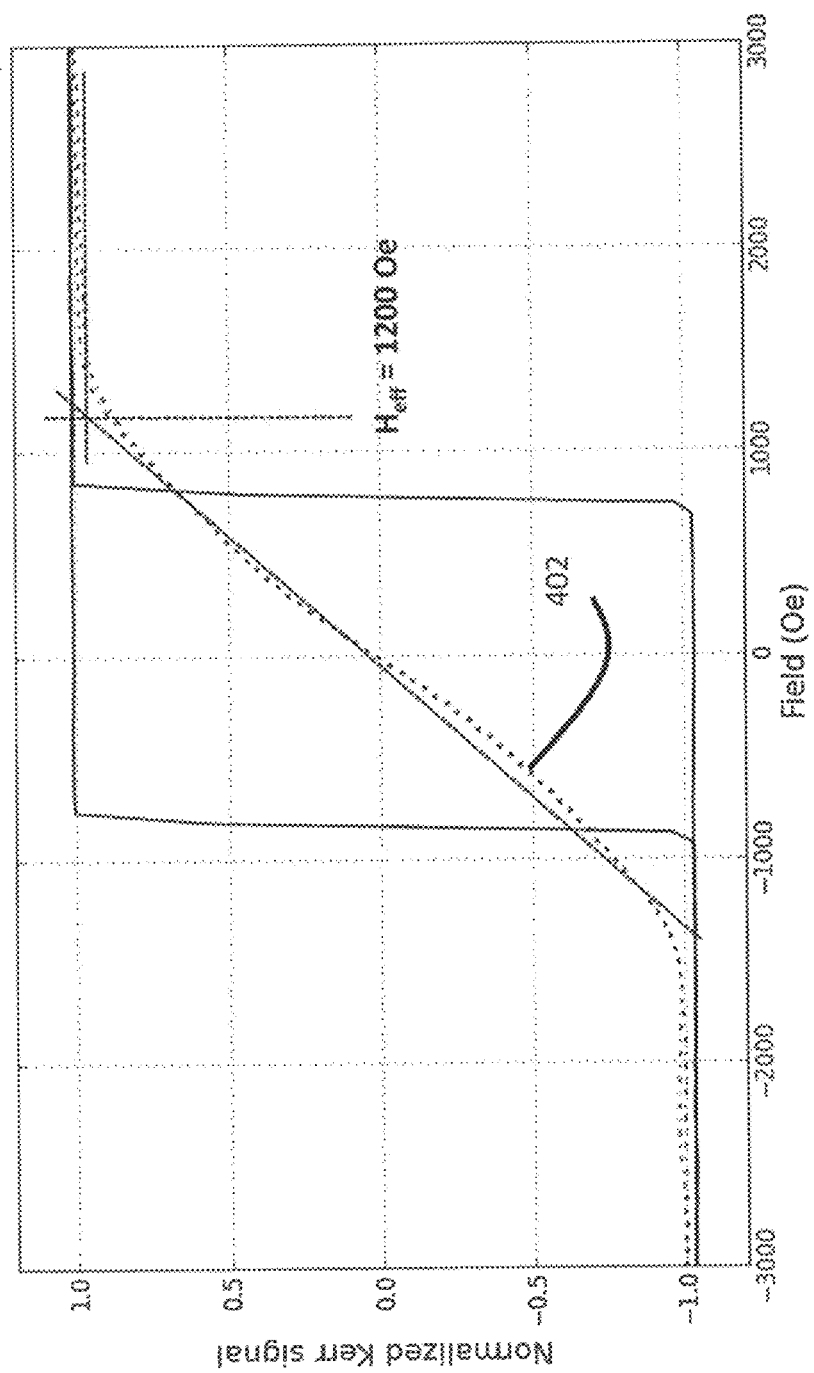
FIG. 4 plots the magnetic field (measured in Oe) against the normalized Kerr signal for the magnetic device shown in FIG. 3. Dotted and solid lines represent a device before and after a high temperature annealing step, respectively.

Depositing Co layers 322 and 330 as well as Ni/Co multilayers 326 on a PMA seed multilayer comprised of either Ta or a α-TaN multilayer, and Ni layer 318 do not necessarily promote the growth of an fcc crystallographic structure ordered with an $L1_0$ ferromagnetic phase. This can be seen in FIG. 4, which plots the magnetic direction (measure as its field, in Oe) against the normalized Kerr signal. In FIG. 4, the hysteresis loop shown as dotted line 402 demonstrates that as-deposited (i.e, without any annealing), magnetic PMA multilayer 370 (made up of cobalt and nickel, as discussed), is weakly magnetized in-plane with in-plane effective demagnetizing field $H_{eff}$=1200 Oe.

In the methods and structures described herein, an annealing step 222 is performed. Annealing at 350 C (or higher) for two hours reverses the magnetic easy axis to the perpendicular direction. This is seen by the solid line shown in FIG. 4. As is seen, after annealing at 350 degrees Celsius for two hours, polar magneto-optical Kerr Effect (polar MOKE) measurements for structure 300 (without a polarizer or MTJ layers) show perfectly square hysteresis loops measured with a magnetic field applied perpendicularly to the film plane (along easy magnetic axis). Thus, magnetic PMA multilayer 370 of FIG. 3 has a magnetic direct on perpendicular to its plane, which is shown in FIG. 3 by the perpendicular arrow next to magnetic PMA multilayer 370.

Figure 5:
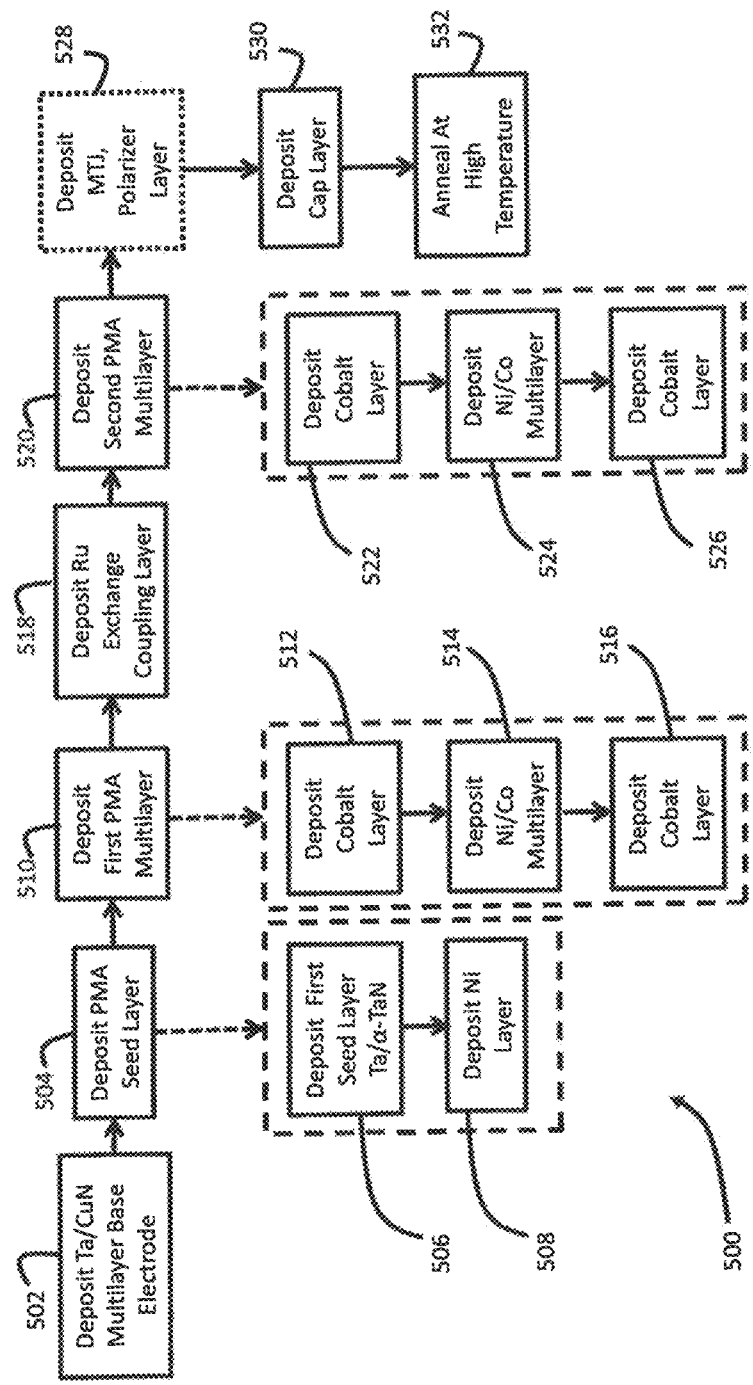
FIG. 5 illustrates a process for manufacturing a perpendicular synthetic antiferromagnetic structure using the concepts described herein.
Figure 6:
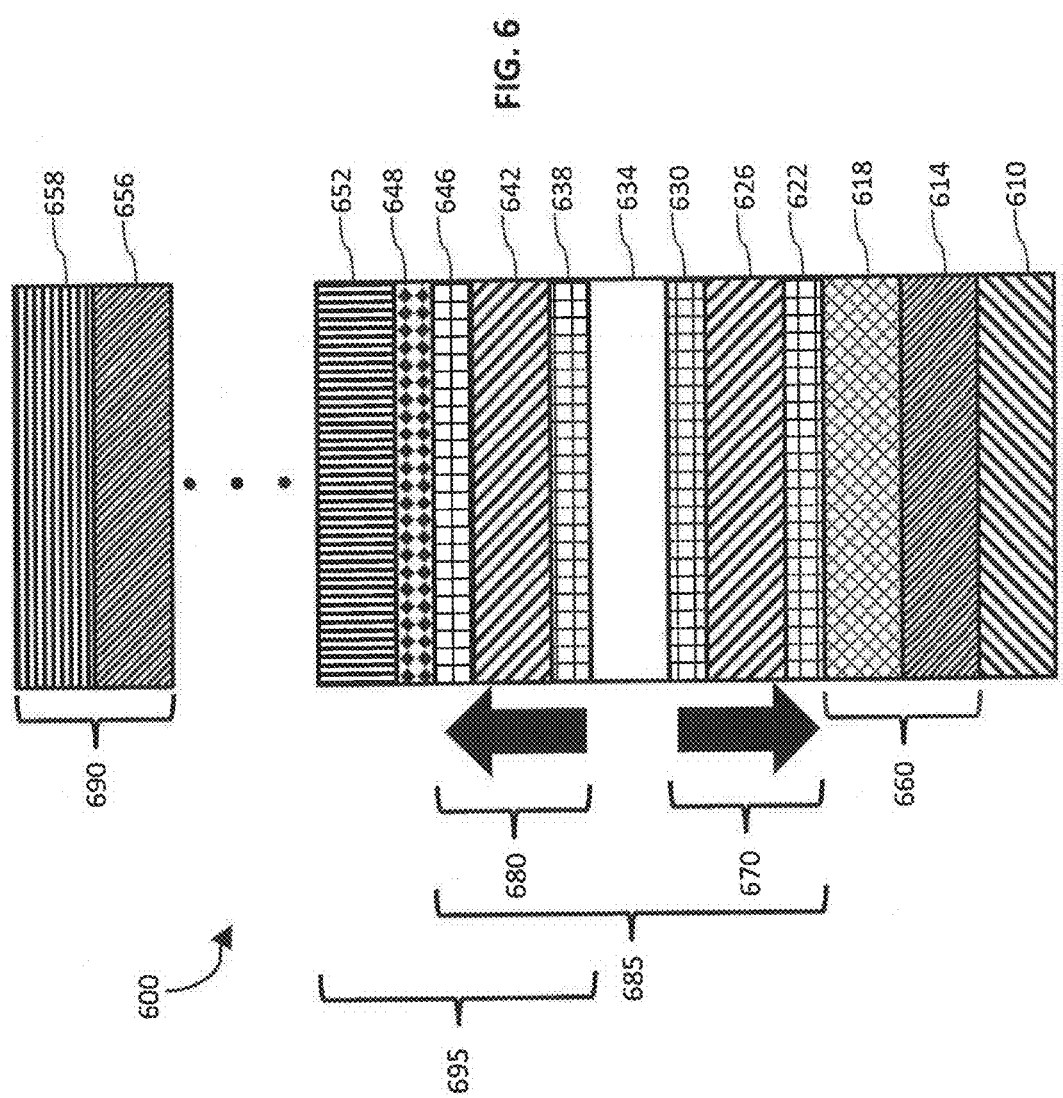
FIG. 6 illustrates the various layers of a perpendicular synthetic antiferromagnetic structure manufactured in accordance with the teachings described herein.

With reference to FIGS. 5 and 6, an embodiment of a perpendicular synthetic antiferromagnetic pSAF structure 600 in accordance with the present teachings will now be discussed. A process 500 for fabricating a pSAF structure for an MRAM cell 600 having a seed layer that can withstand high annealing temperatures is shown in FIG. 5, while the resulting device 600 is shown in FIG. 3. At step 502, a bottom electrode 510 is deposited. Generally, bottom electrode 510 will be integrated with CMOS circuitry previously deposited on a semiconductor wafer (not shown). Bottom electrode 510 can comprise a Ta/CuN multilayer. In one embodiment, the Ta layer of the multilayer has a thickness of three nanometers. In other embodiments, the Ta layer can have a range of 0.5 nm to 10 nm. In an embodiment, the CuN layer of the multilayer has a thickness of forty nanometers. In other embodiments, the CuN layer can have a range of 2 nm to 100 nm.

At step 504, a PMA seed multilayer 660 is deposited. In an embodiment deposition of PMA seed multilayer 660 is performed in a nitrogen N2 atmosphere. PMA seed multilayer 660 can comprise several layers. In an embodiment, PMA seed multilayer 660 is formed by depositing, at step 506, a first seed layer 614. First seed layer 614 can comprise either a layer of Ta or a layer of α-TaN. At step 508, a Ni layer 618 is deposited. Step 506 can be performed by depositing α phase TaN by sputtering in N2 atmosphere. In an embodiment, a first seed layer 614 of Ta can have a thickness of five nanometers. Likewise, a first seed layer 614 of α-TaN 614 can also have a thickness of five nanometers. In other embodiments, a first seed layer made of a layer of Ta can have a thickness ranging from 0.5 nm to 10 nm. Likewise, in an embodiment, a first seed layer 614 made of a layer of α-TaN can have a thickness ranging from 0.5 nm to 10 nm. In an embodiment, Ni layer 618 can have a thickness of 0.93 nm, and in other embodiments, can have a thickness ranging from 0.2 nm to 2.0 nm.

At step 510, a first magnetic PMA multilayer 670 is deposited. As seen in FIGS. 5 and 6, first magnetic PMA multilayer 670 comprises a first cobalt layer 622 and a second cobalt layer 630, separated by a Ni/Co multilayer 626. The process of depositing first magnetic PMA multilayer 670 (step 510) is comprised of step 512, in which Co layer 622 is deposited, step 514, in which the Ni/Co multilayer 626 is deposited, and step 516, in which Co layer 630 is deposited. Steps 512, 514 and 516 can be performed using dc magnetron sputtering techniques.

In an embodiment, Co layer 622 has a thickness of 0.3 nm, and in other embodiments can have a thickness ranging from 0.1 to 0.3 nm. In an embodiment, Ni/Co multilayer 626 can comprise five Ni/Co multilayers, with the Ni layer having a thickness of 0.6 nm and the Co layer having a thickness of 0.2 nm. In other embodiments, each Ni/Co multilayer 626 can comprise Ni layers having a thickness ranging from 0.1 to 0.3 nm and Co layers having a thickness ranging from 0.1 to 3 nm. Likewise, in an embodiment, Co layer 630 has a thickness of 0.18 nm, and in other embodiments can have a thickness ranging from 0.1 to 0.3 nm.

In step 518, an exchange coupling layer 634 is deposited on first magnetic PMA multilayer 670. In an embodiment, a thin exchange coupling layer 634 is comprised of a layer of Ru having a thickness of 0.85 nm. In other embodiments, the Ru layer forming exchange coupling layer 634 has thickness ranging from 0.5 nm to 1.5 nm. This thin Ruthenium (Ru) layer 634 is used to provide antiferromagnetic interlayer exchange coupling between the two components of the pSAF consisting of Co/Ni multilayer structures, i.e., first magnetic PMA multilayer 670, discussed above, and second PMA multilayer 680, discussed below.

At step 520, second PMA multilayer 680 is deposited. In an embodiment, second magnetic PMA multilayer 680 is constructed using the same materials as first magnetic PMA multilayer 670. However, second magnetic PMA multilayer 680 can use different thicknesses for its layers than first magnetic PMA multilayer 670. Likewise, in an embodiment, second magnetic PMA multilayer 680 will have a magnetic direction opposite that of first magnetic PMA multilayer 670, as will be discussed.

As seen in FIGS. 5 and 6, second PMA multilayer 680 comprises a first cobalt layer 638 and a second cobalt layer 646, separated by a Ni/Co multilayer 642. The process of depositing second PMA multilayer 680 (step 520) is comprised of step 522, in which Co layer 630 is deposited, step 524, in which the Ni/Co multilayer 642 is deposited, and step 526, in which Co layer 646 is deposited. Steps 522, 524 and 526 can be performed using dc magnetron sputtering techniques.

In an embodiment, Co layer 638 has a thickness of 0.18 nm, and in other embodiments can have a thickness ranging from 0.1 to 0.3 nm. In an embodiment, Ni/Co multilayer 642 can comprise five Co/Ni multilayers, with the Co layer having a thickness of 0.2 nm and the Ni layer having a thickness of 0.6 nm. In other embodiments, each Ni/Co multilayer 642 can comprise Co layers having a thickness ranging from 0.1 to 0.3 nm and Ni layers having a thickness ranging from 0.1 to 3 nm. Likewise, in an embodiment, Co layer 646 has a thickness of 0.21 nm, and in other embodiments can have a thickness ranging from 0.1 to 0.3 nm. Note that magnetic PMA multilayer 370 will not actually exhibit any PMA after deposition. In order for first and second magnetic PMA multilayers 670, 680 to exhibit PMA, annealing step, step 532. (to be discussed) must be performed.

At step 528, MRAM layers can be deposited, if desired. For example, layers (e.g., non-magnetic tunneling barrier layer 648 and free layer 652) of MTJ 695 and any polarizer layer, if present (not shown in FIG. 6), are deposited. Because step 528 is not required, it is shown as optional (i.e., with a dotted line) to make a functional device in FIG. 5. Thereafter, at step 530 cap 690 can be deposited. In an embodiment, cap 690 can be made of either Ta or α-TaN layer 656, where the Ta layer, when used, can have a thickness of 2 nm while the α-TaN layer, when used, has a thickness of 2 nm. In other embodiments, the Ta layer can have a thickness in the range of 0.5 nm to 20 nm while the α-TaN layer can have a thickness in the range of 0.5 to 20 nm. Cap 690 also can comprise a Ru layer 658. In an embodiment, Ru layer 658 has a thickness of 5 nm, and in other embodiments, Ru layer 658 can have a thickness in the range of 0.5 mm to 20 nm.

As with the embodiment discussed above with respect to FIGS. 2 and 3, depositing first magnetic PMA multilayer 670 (comprised of Co layers 622 and 630 as well as Ni/Co multilayers 626) and second magnetic PMA multilayer 680 (comprised of Co layers 638 and 646 as well as Co/Ni multilayers 542) on a PMA seed multilayer 660 comprised of a first seed layer 614 comprising either Ta or α-TaN, and Ni layer 618 do not necessarily promote the growth of an fcc crystallographic structure ordered with an L1$_0$ ferromagnetic phase. As discussed, this is the reason why the present embodiments perform a temperature annealing step 532 once first magnetic PMA multilayer 670 and second magnetic PMA multilayer 680 have been fabricated. Annealing step 532 can comprise annealing at 350 C for two hours, which as discussed reverses the magnetic easy axis to the perpendicular direction.

Annealing step 532 results in first magnetic PMA multilayer 670 and second magnetic PMA multilayer 680 having magnetic directions perpendicular to their respective planes. This is shown in FIG. 6 by the arrows adjacent to each of first magnetic PMA multilayer 670 and second magnetic PMA multilayer 680. As seen in FIG. 6, in an embodiment, the magnetic direction of first magnetic PMA multilayer 670 and second magnetic PMA multilayer 680 are perpendicular to their respective planes, but in an antiparallel relationship with one another. Together, first magnetic PMA multilayer 670, second magnetic PMA multilayer 680 and thin Ru exchange coupling layer 634 form pSAF structure 685.

In an MRAM device using a structure as in FIG. 6, second magnetic PMA multilayer 680 of pSAF structure 685 will act as the reference layer of an MTJ 695 formed with non-magnetic tunneling barrier layer 648 and free layer 652. Non-magnetic tunneling barrier layer 648 spatially separates magnetic free layer 652 from second magnetic PMA layer 680. First magnetic PMA multilayer 670 will act as a pinning layer to the second magnetic PMA multi layer 680. In other words, First magnetic PMA multilayer 670 will act to pin the magnetic direction of the second magnetic PMA multilayer 680 so that remains perpendicular to its plane, which allows second magnetic PMA multilayer 680 to act as a reference layer of an MTJ.

Figure 7:
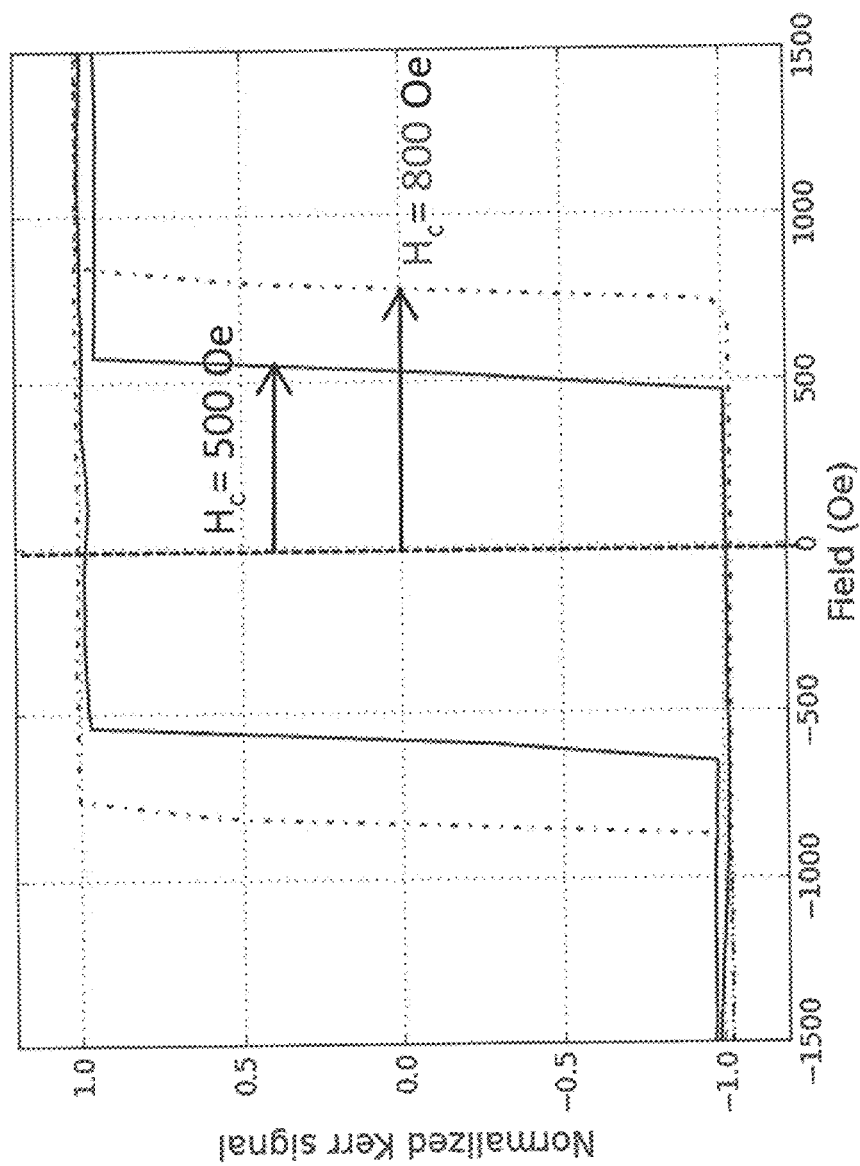
FIG. 7 plots the magnetic field in Oe, against the normalized Kerr signal, which shows the Polar MOKE hysteresis loops of an embodiment as in FIG. 3.

As discussed, one of the benefits of high temperature annealing step 532 is that it causes the magnetic direction of first magnetic PMA multilayer 670 and second magnetic PMA multilayer 680 to become perpendicular to each layer's plane. This behavior is influenced in large part by Ni layer 618 of PMA seed multilayer 660 and use of low resistivity α phase TaN in Ta/α-TaN multilayer 614. Increasing the thickness of Ni layer 618 from 0.45 nm to 0.93 nm improves PMA. This is seen in FIG. 7, where increased coercivity H$_c$ can be seen from approximately 500 to approximately 800 Oe. In particular, FIG. 7 shows Polar MOKE hysteresis loops of an embodiment as in FIG. 3, although the results for an embodiment as shown in FIG. 6 would be very similar. The dotted line in FIG. 7 shows the Polar MOKE hysteresis loops for a PMA seed multilayer 360 with a α TaN layer 314 having a thickness of five nm and Ni layer 318 having a thickness of 0.93 nm. The solid line in FIG. 7 shows the Polar MOKE hysteresis loops for a PMA seed multilayer having a α TaN layer 314 having a thickness of 5.0 nm and a Ni layer 318 having a thickness of 0.45 nm. It can be deducted from FIG. 7 that having either 0.45 nm of Ni or 0.93 nm of Ni deposited on 5.0 nm of alpha tantalum nitride induces PMA after annealing. However higher coercivity observed with 0.93 nm of Ni on 5.0 nm alpha tantalum nitride seed layer indicates that PMA reaches a higher value, thus further improving stability of a perpendicular SAF structure.

Figure 8:
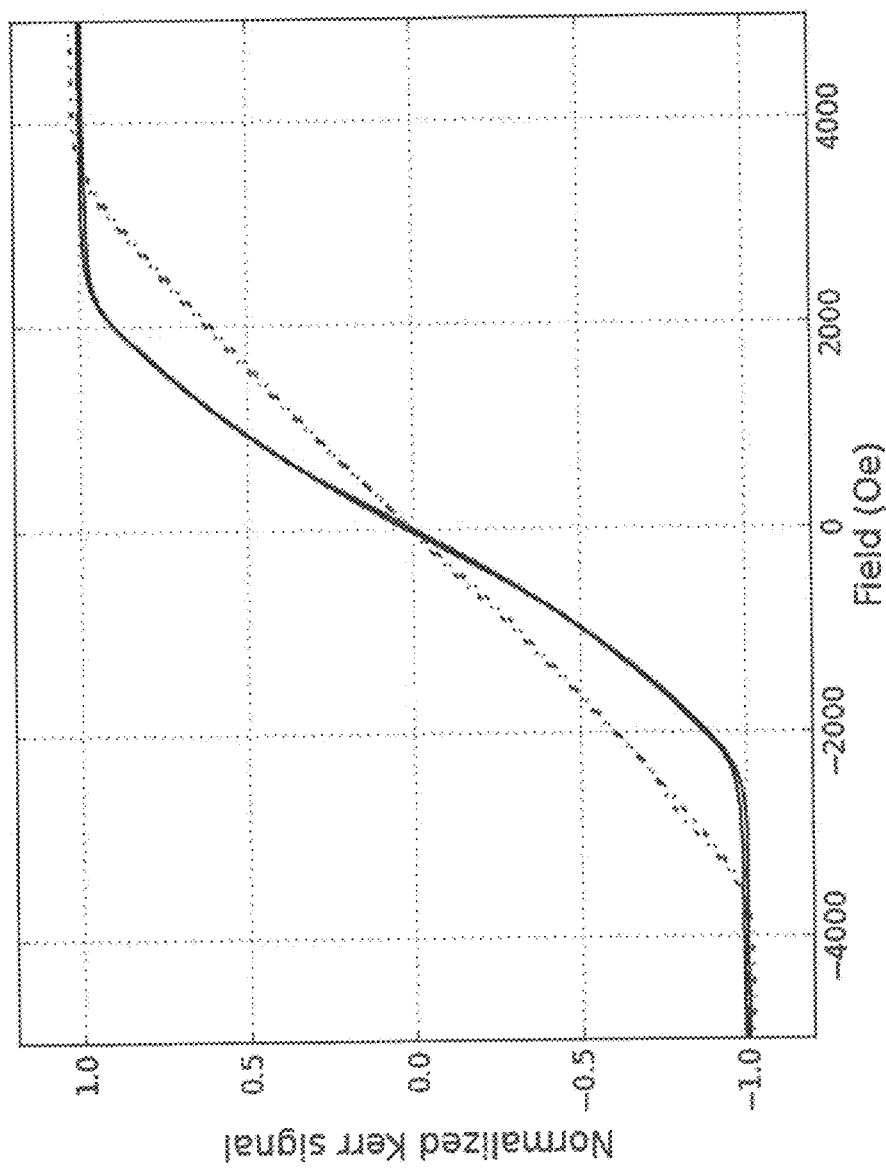
FIG. 8 shows the Polar MOKE hysteresis loops of the structure shown in FIG. 3 having a seed multilayer with a β phase TaN layer and a Ni layer.

Moreover, use of high resistive phase of β TaN in multilayer 614 instead of low resistivity α phase TaN in multilayer 614 in PMA seed multilayer 660 shows no PMA. This is seen in FIG. 8. In particular, FIG. 8 shows the Polar MOKE hysteresis loops of the structure shown in FIG. 3. The dotted line in FIG. 8 shows the Polar MOKE hysteresis loops where PMA seed multilayer 360 has a β TaN layer 314 and a Ni layer 318 having a thickness of 0.93 nm. The dotted line shows the Polar MOKE hysteresis loops prior to annealing. The solid line shows the Polar MOKE hysteresis loops for the structure of FIG. 3 after it has been annealed at 350 degrees Celsius for two hours. A person having ordinary skill in the art will recognize that the round tilted loop indicates that no PMA is present. This demonstrates the importance of proper TaN phase for inducing L1$_0$ ordering during annealing process. In sum, α phase TaN induces L1$_0$ ordering during a high temperature annealing process whereas β phase TaN fails to do so.

Figures 9A, 9B:
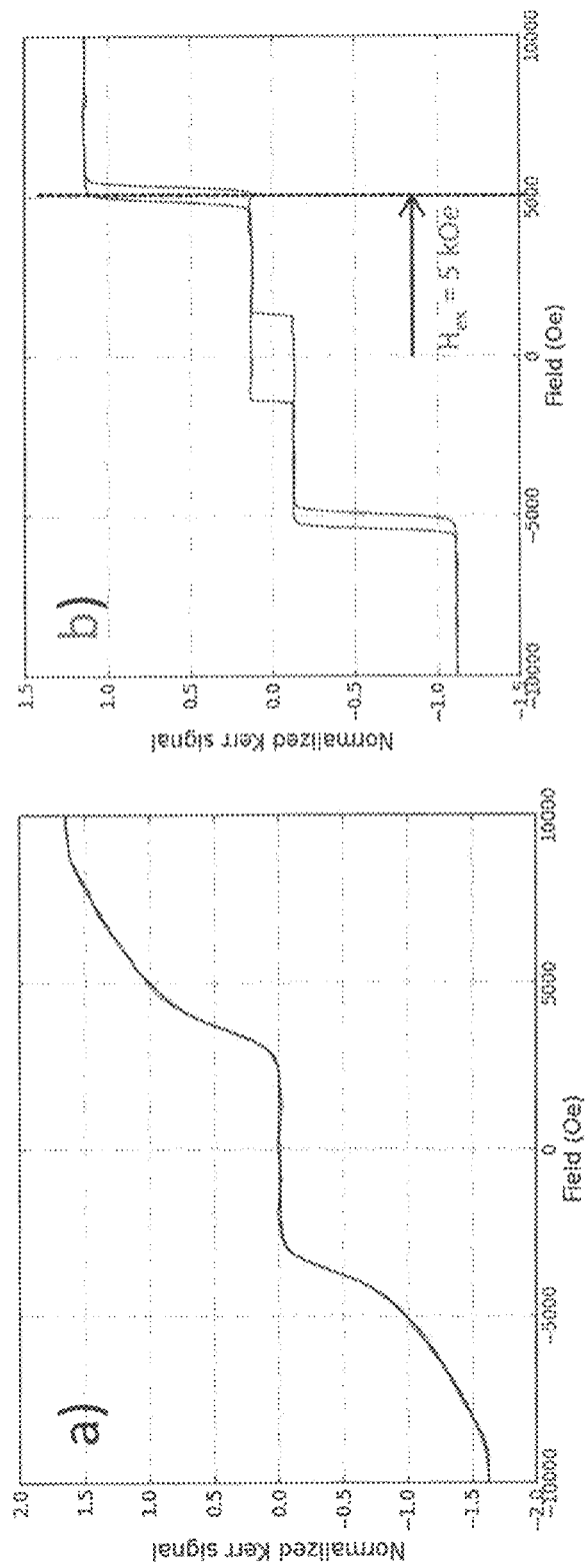
FIG. 9A shows the Polar MOKE hysteresis loops of a perpendicular synthetic antiferromagnetic structure according to the present teachings prior to high temperature annealing.
FIG. 9B shows the Polar MOKE hysteresis loops of a perpendicular synthetic antiferromagnetic structure according to the present teachings after high temperature annealing.

The concepts described herein extend to fabrication of the perpendicular synthetic antiferromagnet structures (pSAF) 685 shown in FIG. 6. As discussed, thin exchange coupling layer 634 made of a film of Ruthenium (Ru) is used to provide antiferromagnetic interlayer exchange coupling between the first magnetic PMA multilayer 670 and second magnetic PMA multilayer 680 (i.e., the two components of pSAF 685). Each of the first and second magnetic PMA multilayers 670, 680 comprise Co/Ni multilayer structures, as described above. PMA seed multilayer 660 is comprised of a seed layer 614 comprised of either Ta or α-TaN, and Ni layer 618, as described above. FIGS. 9A and 9B show Polar MOKE hysteresis loops of perpendicular synthetic antiferromagnet (pSAF) 685. FIG. 9A shows the Polar MOKE hysteresis loops of pSAF structure 685 as deposited (i.e., prior to annealing step 532). FIG. 9B shows the Polar MOKE hysteresis loops of pSAF structure 685 after annealing step 532 is performed at 350 degrees Celsius for two hours. Square loops, which are seen in FIG. 9B, indicate that pSAF structure 685 after annealing has a magnetic direction that is perpendicular to the plane and thus has a perpendicular easy magnetic axis. As seen in FIG. 9B, strong antiferromagnetic coupling (i.e., a high pinning field) is present after annealing. The high pinning field, H$_{ex}$, equals 5 kOe.

Thus, as is seen, use of a PMA seed multilayer 660 comprised of a Ta layer 614 and Ni layer 618 or an α phase TaN layer 614 and a Ni layer 618 for growth of first magnetic PMA multilayer 670 and second magnetic PMA multi layer 680 allows the structure to withstand a high annealing temperature, e.g., an annealing temperature of 350 degrees Celsius or higher. Previous solutions could not achieve high pinning fields with PMA after annealing above 250 C.

In another embodiment, one can use pSAF structure 685 as described herein as a polarizer layer in an orthogonal spin transfer torque structure.

It should be appreciated to one skilled in the art that a plurality of structures 600 can be manufactured and provided as respective bit cells of an MRAM device. In other words, each structure 600 can be implemented as a bit cell for a memory array having a plurality of bit cells. The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising
a PMA seed multilayer comprised of a first seed layer and a nickel (Ni) seed layer, the Ni seed layer being disposed over the first seed layer, the first seed layer comprising a layer of α-TaN;
a first magnetic perpendicular magnetic anisotropy (PMA) multilayer disposed over the PMA seed multilayer, the first magnetic PMA multilayer comprising a first cobalt (Co) layer and a second Co layer, where the first Co layer and the second Co layer are separated by a first nickel/cobalt (Ni/Co) multilayer, wherein the first magnetic PMA multilayer has been annealed at a temperature of 350 degrees Celsius or higher, and has a magnetic direction perpendicular to its plane;
a Ruthenium (Ru) antiferromagnetic interlayer exchange coupling layer disposed over the first magnetic PMA multilayer;
a second magnetic PMA multilayer disposed over the Ru antiferromagnetic interlayer exchange coupling layer, the second magnetic PMA multilayer comprising a third Co layer and a fourth Co layer, where the third Co layer and the fourth Co layer are separated by a second nickel/cobalt (Ni/Co) multilayer, wherein the second magnetic PMA multilayer has been annealed at the temperature of 350 degrees Celsius or higher, and has a magnetic direction perpendicular to its plane;
wherein the first magnetic PMA multilayer, the Ru interlayer exchange coupling layer and the second magnetic PMA multilayer form a perpendicular synthetic antiferromagnet.

2. The magnetic device of claim 1 where in the first seed layer has a thickness of five nanometers.

3. The magnetic device of claim 1 wherein the first Co layer has a thickness of 0.3 nanometers, the second Co layer has a thickness of 0.18 nanometers.

4. The magnetic device of claim 3, wherein the first Ni/Co multilayer comprises a nickel layer having a thickness of 0.6 nanometers and a cobalt layer having a thickness of 0.2 nanometers.

5. The magnetic device of claim 4, wherein the first Ni/Co multilayer is repeated five times.

6. The magnetic device of claim 1, wherein the Ni seed layer of the PMA seed multilayer has a thickness ranging from 0.5 nanometers to 0.95 nanometers.

7. The magnetic device of claim 1, wherein the Ni seed layer of the PMA seed multilayer has a thickness of 0.93 nanometers.

8. The magnetic device of claim 1, wherein the Ruthenium (Ru) antiferromagnetic interlayer exchange coupling layer has a thickness of 0.85 nanometers.

9. The magnetic device of claim 1, wherein the first Co layer has a thickness of 0.3 nanometers, the second Co layer has a thickness of 0.18 nanometers, the third Co layer has a thickness of 0.18 nanometers, the fourth Co layer has a thickness of 0.18 nanometers.

10. The magnetic device of claim 9, wherein the first Ni/Co multilayer comprise a first Ni layer having a thickness of 0.6 nanometers and fifth Co layer having a thickness of 0.2 nanometers.

11. The magnetic device of claim 10 wherein the first Ni/Co multilayer comprises five Ni/Co multilayers.

12. The magnetic device of claim 9, wherein the second Ni/Co multilayer comprise a sixth Co layer having a thickness of 0.2 nanometers and second Ni layer having a thickness of 0.6 nanometers.

13. The magnetic device of claim 12 wherein the second Ni/Co multilayer comprises five Ni/Co multilayers.

14. The magnetic device of claim 1, further comprising:
a non-magnetic tunneling barrier layer over the second magnetic PMA multilayer;
a free magnetic layer over the non-magnetic tunneling barrier layer, the free magnetic layer having a magnetic direction that can precess between a first direction and a second direction, the non-magnetic tunneling barrier layer spatially separating the free magnetic layer from the second magnetic PMA multilayer; and
wherein the second magnetic PMA multilayer, the non-magnetic tunneling barrier layer, and the free magnetic layer form a magnetic tunnel junction.

15. The magnetic device of claim 1, wherein the first seed layer further comprises a layer of Ta.

* * * * *